US010616691B2

(12) United States Patent
Badillo et al.

(10) Patent No.: US 10,616,691 B2
(45) Date of Patent: Apr. 7, 2020

(54) METHOD AND APPARATUS TO INCREASE AUDIO BAND MICROPHONE SENSITIVITY

(71) Applicant: Knowles Electronics, LLC, Itasca, IL (US)

(72) Inventors: Dean Badillo, Schaumburg, IL (US); Michael Jennings, Plano, TX (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 15/775,417

(22) PCT Filed: Nov. 11, 2016

(86) PCT No.: PCT/US2016/061572
§ 371 (c)(1),
(2) Date: May 11, 2018

(87) PCT Pub. No.: WO2017/083679
PCT Pub. Date: May 18, 2017

(65) Prior Publication Data
US 2018/0332404 A1    Nov. 15, 2018

Related U.S. Application Data

(60) Provisional application No. 62/254,449, filed on Nov. 12, 2015.

(51) Int. Cl.
*H04R 19/00* (2006.01)
*H04R 3/06* (2006.01)
(Continued)

(52) U.S. Cl.
CPC ............... *H04R 19/04* (2013.01); *H04R 3/06* (2013.01); *H04R 29/004* (2013.01); *H03F 2200/03* (2013.01); *H04R 2410/03* (2013.01)

(58) Field of Classification Search
CPC ........ H04R 19/04; H04R 3/06; H04R 29/004; H04R 2410/03; H03F 2200/03
See application file for complete search history.

(56) References Cited

U.S. PATENT DOCUMENTS

| 3,660,772 A | 5/1972 | Holt |
| 3,801,933 A | 4/1974 | Teare |

(Continued)

FOREIGN PATENT DOCUMENTS

| CN | 108292906 A | 7/2018 |
| DE | 69933627 | 8/2007 |

(Continued)

OTHER PUBLICATIONS

European Patent Office; International Search Report and Written Opinion; International Application No. PCT/US2016/061572; dated Feb. 15, 2017.

(Continued)

*Primary Examiner* — Sonia L Gay
(74) *Attorney, Agent, or Firm* — Faegre Drinker Biddle & Reath LLP

(57) ABSTRACT

A microphone circuit having an amplifier with an input operably coupled to a microphone motor also includes a low pass filter operably coupled to the output of the amplifier and a positive feedback network that operably couples to an output of the low-pass filter and to the amplifier input. For many useful application settings the aforementioned amplifier has unity gain while the positive feedback network has a fractional gain less than unity.

21 Claims, 4 Drawing Sheets

(51) Int. Cl.
*H04R 29/00* (2006.01)
*H04R 19/04* (2006.01)

(56) References Cited

U.S. PATENT DOCUMENTS

| | | | |
|---|---|---|---|
| 3,927,383 | A | 12/1975 | Fjarlie et al. |
| 4,063,050 | A | 12/1977 | Carlson et al. |
| 4,151,480 | A | 4/1979 | Carlson et al. |
| 4,412,097 | A | 10/1983 | Ishigaki et al. |
| 4,420,655 | A | 12/1983 | Suzuki |
| 4,509,022 | A | 4/1985 | Ridel |
| 4,622,440 | A | 11/1986 | Slavin |
| 4,689,819 | A | 8/1987 | Killion |
| 4,718,099 | A | 1/1988 | Hotvet |
| 4,754,232 | A | 6/1988 | Sasaki |
| 5,083,095 | A | 1/1992 | Madaffari |
| 5,097,224 | A | 3/1992 | Madaffari et al. |
| 5,193,116 | A | 3/1993 | Mostardo |
| 5,255,094 | A | 10/1993 | Yong et al. |
| 5,337,011 | A | 8/1994 | French et al. |
| 5,524,150 | A | 6/1996 | Sauer |
| 5,861,779 | A | 1/1999 | Loeppert et al. |
| 5,978,490 | A | 11/1999 | Choi et al. |
| 6,035,049 | A | 3/2000 | Engh et al. |
| 6,353,344 | B1 | 3/2002 | Lafort |
| 6,389,142 | B1 | 5/2002 | Hagen et al. |
| 6,421,448 | B1 | 7/2002 | Arndt et al. |
| 6,617,925 | B2 | 9/2003 | Hoang |
| 6,654,468 | B1 | 11/2003 | Thompson |
| 6,714,081 | B1 | 3/2004 | Xu |
| 7,113,604 | B2 | 9/2006 | Thompson |
| 7,634,096 | B2 | 12/2009 | Fallesen |
| 7,679,448 | B1 | 3/2010 | McAdam et al. |
| 7,920,027 | B2 | 4/2011 | Keerti |
| 8,970,307 | B2 | 3/2015 | Marra |
| 9,438,175 | B2 | 9/2016 | Onizuka |
| 9,843,292 | B2 | 12/2017 | Jennings et al. |
| 2003/0128856 | A1 | 7/2003 | Boor |
| 2005/0078841 | A1 | 4/2005 | Boor |
| 2005/0213787 | A1 | 9/2005 | Collins |
| 2005/0242791 | A1 | 11/2005 | Rajapandian et al. |
| 2008/0002841 | A1 | 1/2008 | Baker et al. |
| 2010/0254549 | A1* | 10/2010 | Onishi ............... H01L 27/0811 381/120 |
| 2011/0025422 | A1 | 2/2011 | Marra et al. |
| 2011/0050345 | A1 | 3/2011 | Quack |
| 2011/0056302 | A1 | 3/2011 | Lutz |
| 2014/0266458 | A1 | 9/2014 | Scott |
| 2015/0035605 | A1 | 2/2015 | Lam |
| 2015/0137834 | A1* | 5/2015 | Steiner ............... H03F 1/34 324/686 |
| 2015/0214908 | A1 | 7/2015 | Kim |
| 2015/0244328 | A1 | 8/2015 | Toivonen |
| 2018/0152147 | A1* | 5/2018 | Gabai ............... H03F 1/0272 |
| 2018/0206043 | A1* | 7/2018 | Gabai ............... H03F 1/56 |

FOREIGN PATENT DOCUMENTS

| | | |
|---|---|---|
| EP | 0509742 B1 | 8/1997 |
| EP | 0982971 A2 | 1/2000 |
| EP | 1331835 A2 | 7/2003 |
| EP | 0982971 B1 | 10/2006 |
| EP | 2421281 A1 | 2/2012 |
| JP | S5964994 | 4/1984 |
| JP | 60160711 | 8/1985 |
| JP | 2006229336 A | 8/2006 |
| WO | 8302862 A1 | 8/1983 |
| WO | 2005/039046 A1 | 4/2005 |
| WO | 2005/104603 A1 | 11/2005 |
| WO | 2007103401 A1 | 9/2007 |
| WO | 2014/107843 A1 | 7/2014 |
| WO | 2017/083679 A1 | 5/2017 |

OTHER PUBLICATIONS

Van Der Donk et al.; Amplitude-modulated electro-mechanical feedback system for silicon condenser microphones; Journal of Micromechanics & Microengineering, Institute of Physics Publishing; vol. 2, No. 3; Sep. 1, 1992.

Van Der Donk et al.; Preliminary results of a silicon condenser microphone with internal feedback; Transducers; Jun. 24, 1991.

European Patent Office; International Search Report; International Application No. PCT/US2004/033997; dated Mar. 17, 2005.

European Patent Office; International Search Report and Written Opinion; PCT International Application No. PCT/US2016/053728; dated Nov. 16, 2016.

* cited by examiner

METHOD AND APPARATUS TO INCREASE AUDIO BAND MICROPHONE SENSITIVITY

RELATED APPLICATIONS

This application claims benefits under 35 U.S.C. 119(e) to Provisional Application Ser. No. 62/254,449, filed on Nov. 12, 2015, having inventors Michael Jennings et al., titled "METHOD AND APPARATUS TO INCREASE AUDIO BAND MICROPHONE SENSITIVITY", and is incorporated herein by reference.

TECHNICAL FIELD

These teachings relate generally to microphones and more particularly to microphone sensitivity.

BACKGROUND

Microphones (e.g., MEMS capacitor mics) are known in the art and typically convert sound pressure to electrical signals. The corresponding conversion factor is often referred to as the microphone's sensitivity. That sensitivity typically varies with frequency. In many cases microphones have a relatively flat response at audio frequencies while exhibiting a significant peak in the ultrasonic region due to mechanical resonances of the sensor. Although such peaks occur in the inaudible ultrasonic region, such peaks can nevertheless result in audible distortion.

In some application settings it can be desirable to increase a microphone's sensitivity. Unfortunately, typical approaches for boosting sensitivity in the audio band also boost sensitivity in the ultrasonic band. As a result, boosting sensitivity can result in increased unwanted audible distortion due to boosted peaks in the ultrasonic band.

BRIEF DESCRIPTION OF THE DRAWINGS

The above needs are at least partially met through provision of the method and apparatus to increase audio band microphone sensitivity described in the following detailed description, particularly when studied in conjunction with the drawings, wherein.

Figure 1:
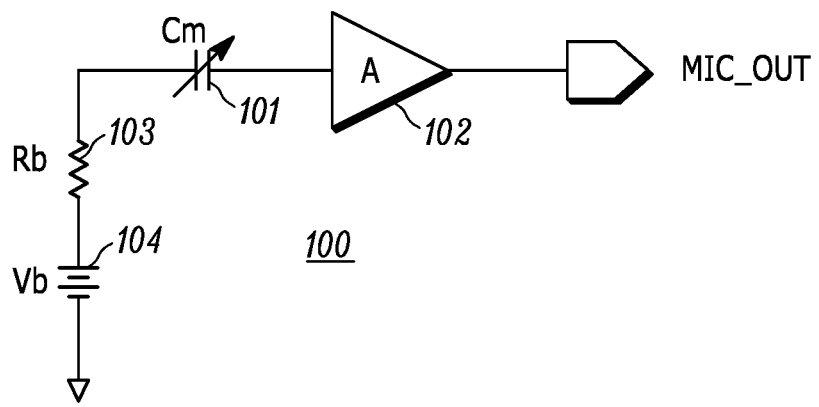
FIG. 1 illustrates a schematic diagram as configured in accordance with the prior art.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, pursuant to these various embodiments, a microphone circuit having an amplifier with an input operably coupled to a microphone motor also includes a low pass filter operably coupled to the output of the amplifier and a positive feedback network that operably couples to output of the low-pass filter and to the microphone motor. For many useful application settings the aforementioned amplifier has unity gain while the positive feedback network has a fractional gain less than unity.

In one example, a method of operating a microphone amplifier circuit includes producing an amplified microphone signal by amplifying an electro-acoustic sensor output signal with an amplifier. The method also includes producing a filtered microphone output signal by filtering, using a low pass filter, the amplified microphone signal and feeding back the filtered microphone output signal to the electro acoustic sensor using a positive feedback network.

In one example, the amplifier has unity gain. In one example, the positive feedback network has a fractional gain less than unity. In one example, the microphone has a transfer function comprising $A*H(j\omega)/(1+\beta*A*H(j\omega))$, where A represents gain for the amplifier, $H(j\omega)$ represents a transfer function of the low-pass filter, and $\beta$ represents gain of the positive feedback network, wherein $H(j\omega)=1/(j\omega/\omega p+1)$ such that $$\frac{\text{Mic\_out}}{\text{In}}(j\omega) = \frac{A}{1-\beta A} \frac{1}{j\omega/\omega p(1-\beta A)+1}.$$

In one example, an electro-mechanical transducer assembly includes an electro-acoustic sensor and an amplifier circuit. The amplifier circuit includes an amplifier having an input and an output, the input operably coupled to the electro-acoustic sensor. The amplifier circuit includes a low pass filter having an input and an output, the input operably coupled to the output of the amplifier and a positive feedback network operably coupled to the output of the low-pass filter and to the electro-acoustic sensor.

In one example the amplifier has unity gain. In one example, the positive feedback network has a fractional gain less than unity. In one example, the electro-acoustic sensor has a transfer function comprising $A*H(j\omega)/(1+\beta*A*H(j\omega))$, where A represents gain for the amplifier, $H(j\omega)$ represents a transfer function of the low-pass filter, and $\beta$ represents gain of the positive feedback network, wherein $H(j\omega)=1/(j\omega/\omega p+1)$ such that $$\frac{\text{Mic\_out}}{\text{In}}(j\omega) = \frac{A}{1-\beta A} \frac{1}{j\omega/\omega p(1-\beta A)+1}.$$

In one example, the positive feedback network includes a feedback capacitor operatively coupled to the low pass filter and a bias filter capacitor operatively coupled to the feedback capacitor and to the electro-acoustic sensor.

In one example, a microphone amplifier circuit includes an amplifier having an first input and a first output, the first input configured to couple to a output of a microphone motor, a low pass filter having an second input and a second output, the second input operably coupled to the first output of the amplifier, and a positive feedback network operatively coupled to the second output of the low-pass filter and configured to couple to an input of the microphone.

In one example, the amplifier has unity gain. In one example, the positive feedback network has a fractional gain less than unity. In one example, the circuit has a transfer function comprising A*H(jω)/(1+β*A*H(jω)), where A represents gain for the amplifier, H(jω) represents a transfer function of the low-pass filter, and β represents gain of the positive feedback network wherein H(jω)=1/(jω/ωp+1) such that $$\frac{\text{Mic\_out}}{\text{In}}(j\omega) = \frac{A}{1-\beta A}\frac{1}{j\omega/\omega p(1-\beta A)+1}.$$

In one example, the positive feedback network includes a feedback capacitor operatively coupled to the second output of the low pass filter and a bias capacitor operatively coupled to the feedback capacitor and configured to couple to the input one plate of the microphone motor.

So configured, part of the aforementioned circuit serves to boost gain while another part of the circuit provides low frequency filtering that attenuates the boosting of ultrasonic portions of the signal. Such a circuit can serve to boost sensitivity in the audio band without also boosting sensitivity in the ultrasonic band. Those skilled in the art will appreciate that these teachings do not require use of a high-gain amplifier and accordingly can avoid any corresponding additional noise or current consumption attributable to such a component.

Figure 2:
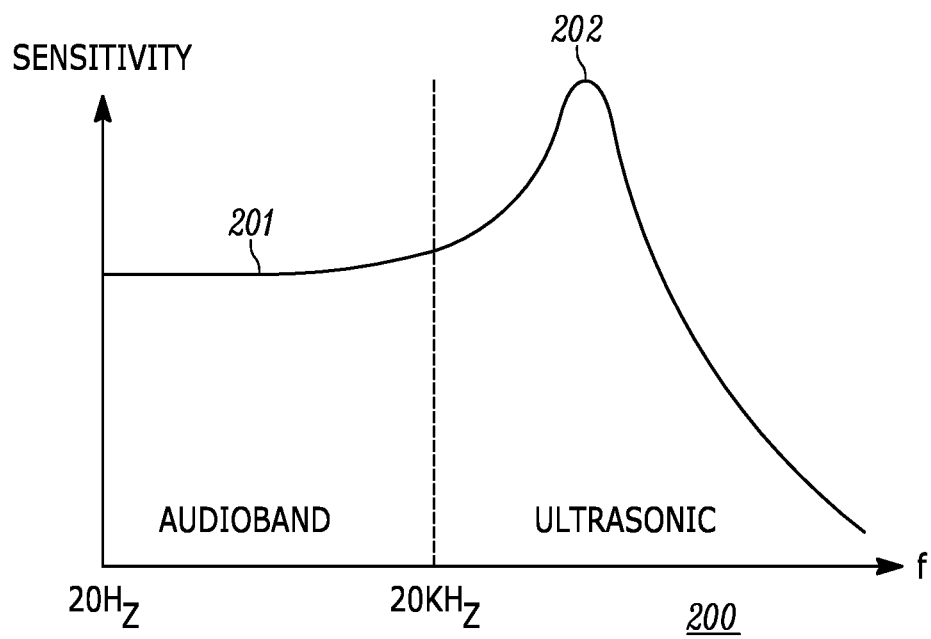
FIG. 2 illustrates a graph as configured in accordance with the prior art.

These and other benefits may become clearer upon making a thorough review and study of the following detailed description. Referring now to the drawings, and in particular to FIGS. 1 and 2, it may be helpful to first briefly recount certain characterizing features and attributes of prior art practice in these regards.

FIG. 1 presents a simple microphone model 100 as typifies the prior art of an electro-mechanical transducer assembly such as a MEMS capacitor microphone assembly. The microphone sensor (also often referred to as the motor or an electo-acoustic sensor) 101 is represented by a variable capacitor with a high impedance 103 bias voltage 104 applied to one plate. This plate is free to move with sound pressure and is often referred to as the diaphragm. The second plate of the capacitor is immobile and connects to the input of an amplifier 102. The input of the amplifier 102 is biased through a high impedance (not shown) to ground although another voltage (not shown) can be used if desired. The amplifier 102 has unity gain.

FIG. 2 presents a graph 200 depicting typical sensitivity for such a prior art microphone. This sensitivity includes a relatively flat region 201 that occurs at audio frequencies (i.e., between about 20 Hz and 20 kHz). This sensitivity also exhibits a sharp peak 202 in the ultrasonic region. As mentioned above, that sensitivity in the ultrasonic region can lead to objectionable audible distortion.

Figure 3:
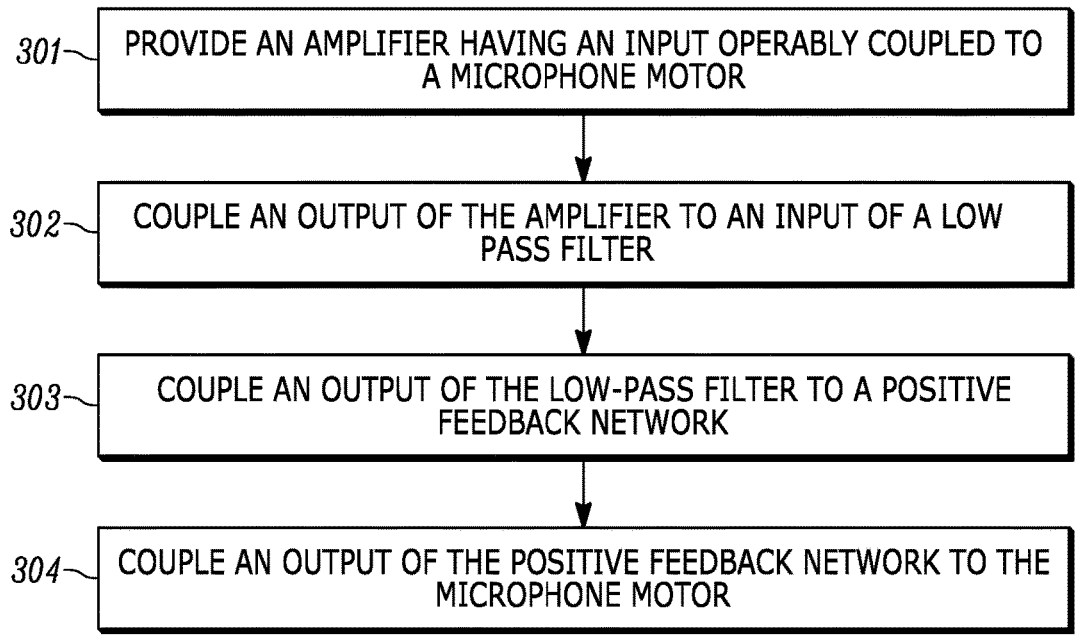
FIG. 3 illustrates a flow diagram as configured in accordance with various embodiments of these teachings.

A straight forward method of increasing the sensitivity in the audio band without increasing the ultrasonic sensitivity (or even attenuating it), is to insert a filter between the motor and the amplifier. If the filter is low pass and amplifier gain is greater than one, then the desired sensitivity modifications can be achieved. In practice however this is difficult to implement. First, because the variable motor capacitance is on the order of 1 pF, any low pass filter between the motor and the amplifier requires a capacitance <0.1 pF or else suffer an undesirable reduction in audio band sensitivity. Now in order to realize a filter with a pole at the upper audio band, for example 10 KHz, an enormous resistance is needed. The consequential thermal noise of adding large resistance dramatically decreases the dynamic range and signal to noise ratio of the microphone. The second challenge of implement the system in FIG. 3 is the potential complexity of a high gain amplifier design. A unity gain amplifier can be implemented in its simplest form with a single transistor (i.e. a source follower MOSFET). High gain generally require more circuitry, which requires more current and adds more noise, both which are preferably avoided.

Another approach to place the low pass filter after the amplifier. The benefit here is that because the filter no longer loads the motor, the low capacitance constraint is removed and the filter noise can be greatly reduced. However, now the amplifier sees the high ultrasonic output that was previously filtered in the approach where the LPF was placed in front of the amplifier. Large ultrasonic signals can cause the amplifier to produce unwanted audible distortion. The previously mentioned drawbacks of including a high gain amplifier also apply here.

FIG. 3 presents an illustrative process 300 that is compatible with overcoming one or more of the above drawbacks. At block 301 this process 300 provides an amplifier having an input that operably couples to a microphone motor. At block 302 the output of that amplifier is coupled to the output of a low-pass filter. At block 303 the output of that low-pass filter is operably coupled to a positive feedback network. And at block 304 the output of that positive feedback network operably couples to the microphone motor.

Figure 4:
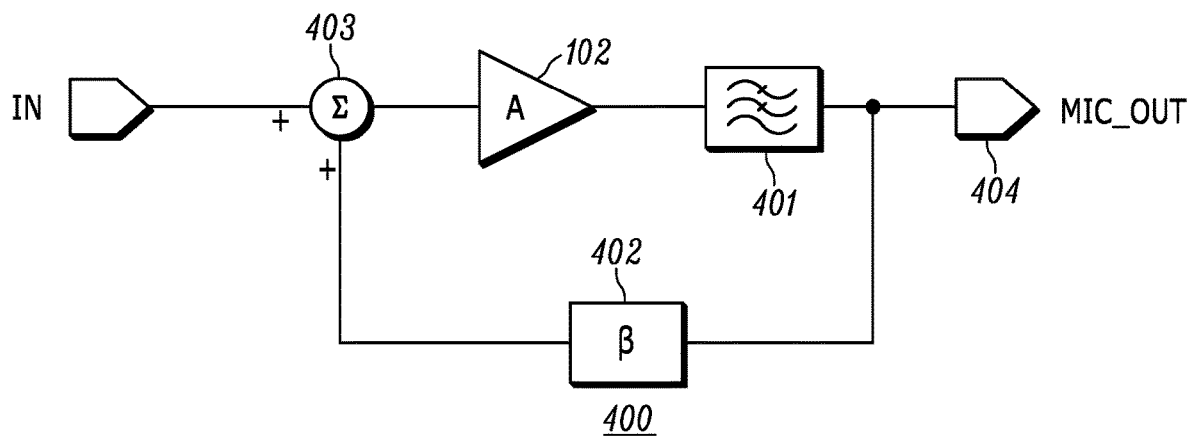
FIG. 4 illustrates a block diagram as configured in accordance with various embodiments of these teachings.

FIG. 4 presents an illustrative block diagram 400 example in the foregoing regards. In this illustrative example the microphone amplifier 102 has a gain A (which is presumed here to constitute a unity gain). The output of this amplifier 102 connects to a low-pass filter 401 having a corresponding transfer function H(jω). The output of the low-pass filter 401 connects to a positive feedback network 402 having a gain of β. The output of the positive feedback network 402 is applied to the microphone motor, which is represented by a summing block 403. The output 404 of this overall circuit comprises the output of the low-pass filter 401.

The transfer function, Mic_out/In, of the closed loop system shown in FIG. 4 is A*H(jω)/(1+β*A*H(jω)). If H(jω)=1/(jω/ω$_p$+1) then $$\frac{\text{Mic\_out}}{\text{In}}(j\omega) = \frac{A}{1-\beta A}\frac{1}{j\omega/\omega p(1-\beta A)+1}.$$

The first term in the foregoing equation corresponds to the gain boosting. The second term represents the low frequency filtering that attenuates the boost at ultrasonic frequencies.

Figure 5:
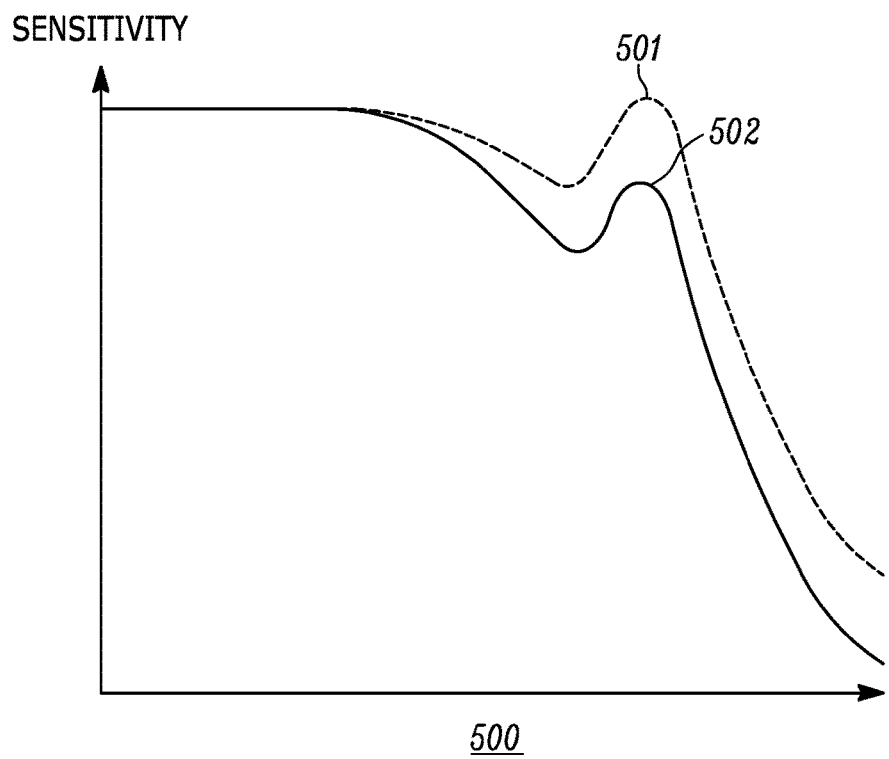
FIG. 5 illustrates a graph as configured in accordance with various embodiments of these teachings.

A graph 500 comparing the results of the above-described gain boosting technique as generally compared to traditional methods appears in FIG. 5. A typical peak 501 in the ultrasonic region appears as a phantom line. The same peak 502 as occurs in accordance with the above-described teachings appears as a solid line.

Those skilled in the art will appreciate that the present teachings do not adversely impact sensitivity in the audio band as compared to prior art practices but greatly reduce the ultrasonic peak and hence results in less audible distortion as a result. Accordingly, for an equal audio band sensitivity increase and equal filtering, the present teachings result in a lower ultrasonic peak than typical prior art approaches.

As one example in these regards, when the microphone amplifier 102 has unity gain and the gain β of the positive feedback network 402 is ½, the audio band sensitivity will increase by a factor of 2 (which corresponds to an increase of 6 dB) without a concurrent boost to the amplitude of the ultrasonic band.

Figure 6:
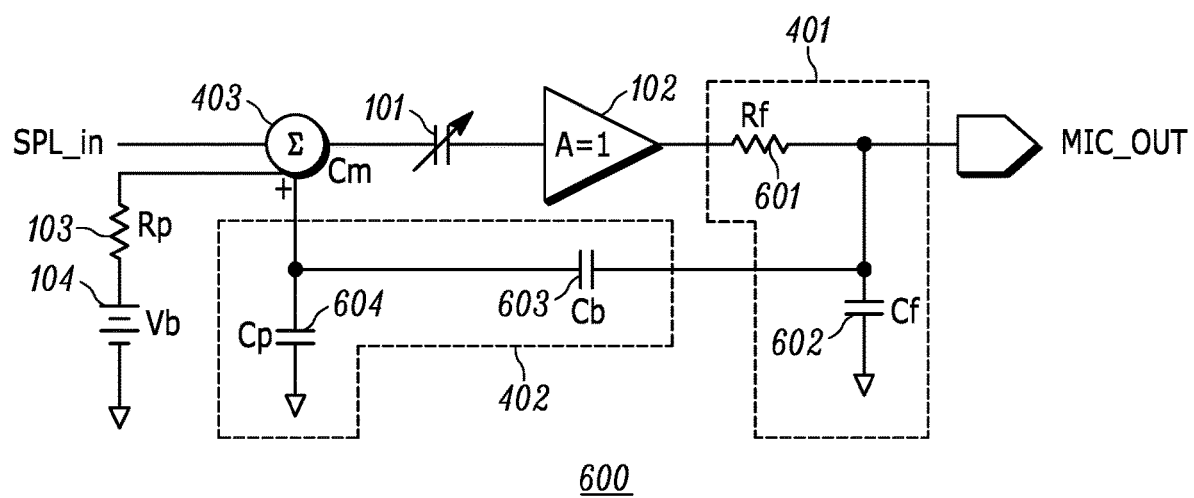
FIG. 6 illustrates a schematic diagram as configured in accordance with various embodiments of these teachings.

FIG. 6 presents a more specific implementation in these regards. It will be understood that the specific details of this particular circuit 600 are not to be taken as indicating any particular limitations as this circuit 600 is intended instead to serve as an illustrative example.

In this illustrative example the aforementioned low-pass filter 401 includes a resistor 601 in combination with a capacitor 602. The aforementioned positive feedback network 402, in turn, includes a pair of capacitors that include feedback capacitor 603 and bias capacitor 604. As shown, the feedback capacitor has a node coupled to the low pass filter and in particular to the resistor 601 and capacitor 602. The feedback capacitor has another node coupled to a node of the bias capacitor 604. The bias capacitor has another node coupled to ground. The signal passing through the feedback capacitor 603 from the low pass filter is fed back to the electro-acoustic sensor 101 via the summing block 403. Any suitable values may be used and in one example, the resistor 401 may be 4 k ohms, the capacitor 602 may be 3.3 nanofarads and the feedback capacitor 603 and bias capacitor 604 may be 17 picofarads. The summing block 403 also illustrates modeling of the sound pressure displacement of the motor diaphragm.

Figure 7:
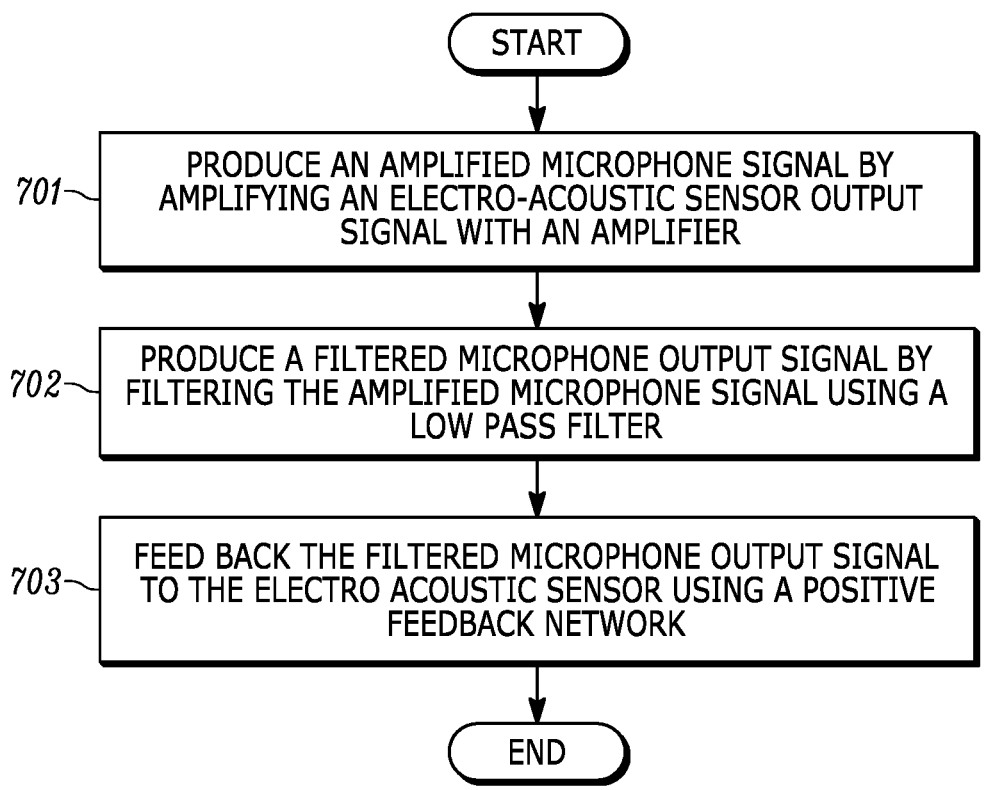
FIG. 7 is a flow chart illustrating one example of a method in accordance with the disclosure.

As illustrated by the circuit of FIG. 6 and as shown, in FIG. 7. The amplifier 102 produces 701 an amplified microphone signal by amplifying an electro-acoustic sensor output signal. The microphone amplifier buffers a low impedance coupling with another component that receives the amplified microphone signal (not shown). The amplified microphone signal is provided to the low pass filter 401. The low pass filter 401 produces 702 a filtered microphone output signal by filtering the amplified microphone signal the filtered microphone output signal is provided to the positive feedback network 402 and in this example to feedback capacitor 603. The filtered microphone output signal (MIC_out) is fed back 703 through the positive feedback network 402 to the electro acoustic sensor 101.

The transfer function of the implementation presented in FIG. 6 can be show to be $$\frac{\text{SPL\_in}}{\text{Mic\_out}}(j\omega) = \frac{1}{1 - Cb/(Cp + Cb)} \frac{1}{j\omega RfCf / Cb/(Cp + Cb) + 1}.$$

Here Cm is the microphone variable capacitance, Vb is the bias voltage, Rp is the bias impedance, Cp and Cb form the feedback network and Rf and Cf form the low pass filter. The amplifier in this example has unity gain. The summing block is added to model the sound pressure displacement of the motor diaphragm. These teachings provide for amplifying the sensitivity of a microphone in the audio band without increasing sensitivity at ultrasonic frequencies. In addition, a high gain amplifier is not needed thus avoiding any additional noise or current consumption. These teachings can be readily employed in a cost-effective manner and without unduly burdening form factor or space requirements.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. A method of operating a microphone amplifier circuit, the method comprising:
   producing an amplified microphone signal by amplifying an electro-acoustic sensor output signal that is output by an electro-acoustic sensor, with an amplifier;
   producing a filtered microphone output signal to be output by the microphone amplifier circuit, by filtering the amplified microphone signal using a low pass filter; and
   feeding back the filtered microphone output signal to the electro-acoustic sensor using a positive feedback network.

2. The method of claim 1 wherein the amplifier has unity gain.

3. The method of claim 2 wherein the positive feedback network has a fractional gain less than unity.

4. The method of claim 1 wherein the microphone has a transfer function comprising A*H(jω)/(1+β*A*H(jω)), where A represents gain for the amplifier, H(jω) represents a transfer function of the low-pass filter, and β represents gain of the positive feedback network.

5. The method of claim 4 wherein H(jω)=1/(jω/ω$_p$+1) such that $$\frac{\text{Mic\_out}}{\text{In}}(j\omega) = \frac{A}{1 - \beta A} \frac{1}{j\omega/\omega p(1 - \beta A) + 1}.$$

6. An electro-mechanical transducer assembly comprising:
   an electro-acoustic sensor; and
   an amplifier circuit comprising:
      an amplifier having an input and an output, the input operably coupled to the electro-acoustic sensor;
      a low pass filter having an input and an output, the input operably coupled to the output of the amplifier and the low pass filter configured to produce a filtered signal to be output, by filtering an amplified signal from the output of the amplifier; and
      a positive feedback network operably coupled to the output of the low-pass filter and to the electro-acoustic sensor.

7. The electro-mechanical transducer assembly of claim 6 wherein the amplifier has unity gain.

8. The electro-mechanical transducer assembly of claim 7 wherein the positive feedback network has a fractional gain less than unity.

9. The electro-mechanical transducer assembly of claim 6 wherein the electro-acoustic sensor has a transfer function comprising A*H(jω)/(1+β*A*H(jω)), where A represents gain for the amplifier, H(jω) represents a transfer function of the low-pass filter, and β represents gain of the positive feedback network.

10. The electro-mechanical transducer assembly of claim 9 wherein $H(j\omega)=1/(j\omega/\omega_p+1)$ such that $$\frac{\text{Mic\_out}}{\text{In}}(j\omega) = \frac{A}{1-\beta A} \frac{1}{j\omega/\omega p(1-\beta A)+1}.$$

11. The electro-mechanical transducer assembly of claim 6 wherein the positive feedback network comprises a feedback capacitor operatively coupled to the low pass filter and a bias filter capacitor operatively coupled to the feedback capacitor and to the electro-acoustic sensor.

12. A microphone amplifier circuit comprising:
   an amplifier having a first input and a first output, the first input configured to couple to an output of a microphone motor;
   a low pass filter having a second input and a second output, the second input operably coupled to the first output of the amplifier, the low pass filter configured to produce a filtered signal to be output, by filtering an amplified signal from the first output of the amplifier; and
   a positive feedback network operatively coupled to the second output of the low-pass filter and configured to couple to an input of the microphone.

13. The microphone amplifier circuit of claim 12 wherein the amplifier has unity gain.

14. The microphone amplifier circuit of claim 13 wherein the positive feedback network has a fractional gain less than unity.

15. The microphone amplifier circuit of claim 12 wherein the circuit has a transfer function comprising $A*H(j\omega)/(1+\beta*A*H(j\omega))$, where A represents gain for the amplifier, $H(j\omega)$ represents a transfer function of the low-pass filter, and $\beta$ represents gain of the positive feedback network.

16. The microphone amplifier circuit of claim 15 wherein $H(j\omega)=1/(j\omega/\omega_p+1)$ such that $$\frac{\text{Mic\_out}}{\text{In}}(j\omega) = \frac{A}{1-\beta A} \frac{1}{j\omega/\omega p(1-\beta A)+1}.$$

17. The microphone amplifier circuit of claim 12 wherein the positive feedback network comprises a feedback capacitor operatively coupled to the second output of the low pass filter and a bias capacitor operatively coupled to the feedback capacitor and configured to couple to one plate of the microphone motor.

18. The method of claim 4 wherein the amplifier has unity gain.

19. The electro-mechanical transducer assembly of claim 9 wherein the amplifier has unity gain.

20. The microphone amplifier circuit of claim 15 wherein the amplifier has unity gain.

21. An electro-mechanical transducer assembly comprising:
   an electro-acoustic sensor; and
   an amplifier circuit comprising:
      an amplifier having an input and an output, the input operably coupled to the electro-acoustic sensor;
      a low pass filter having an input and an output, the input operably coupled to the output of the amplifier;
      a positive feedback network operably coupled to the output of the low-pass filter and to the electro-acoustic sensor; and
   wherein the amplifier has unity gain.

* * * * *